United States Patent [19]

Aoyama

[11] Patent Number: 5,359,636
[45] Date of Patent: Oct. 25, 1994

[54] REGISTER CONTROL CIRCUIT FOR INITIALIZATION OF REGISTERS

[75] Inventor: Koichiro Aoyama, Tokyo, Japan

[73] Assignee: NEC Corporation, Japan

[21] Appl. No.: 914,299

[22] Filed: Jul. 15, 1992

[30] Foreign Application Priority Data

Jul. 24, 1991 [JP] Japan ................ 3-184248

[51] Int. Cl.$^5$ ................ H03K 21/02; H03K 23/42
[52] U.S. Cl. ................ 377/73; 377/78; 307/272.3
[58] Field of Search ........ 377/73, 78, 79, 107, 377/104, 72; 307/272.3

[56] References Cited

U.S. PATENT DOCUMENTS

| | | | |
|---|---|---|---|
| 3,812,384 | 5/1974 | Skorup | 307/272.3 |
| 4,181,862 | 1/1980 | Dingwall | 377/107 |
| 4,558,457 | 12/1985 | Tabata | 377/107 |
| 4,630,295 | 12/1986 | Kamuro et al. | 377/072 |
| 4,882,505 | 11/1989 | Furman | 377/107 |

Primary Examiner—John S. Heyman
Attorney, Agent, or Firm—Laff, Whitesel, Conte & Saret

[57] ABSTRACT

A register control circuit has a plurality of registers, a control circuit for producing clock signals, and a logic circuit for producing latch clocks based on a reset signal and the clock signals. A shift data is inputted to a first one of the plurality of registers through a 2-input AND gate. The latch clocks are forced to become active simultaneously under a state in which an input to the first stage register being controlled to "0". The shift register is initialized in such a way that a "0" input is sequentially transferred from the first stage register to the final stage register. The shift register can be formed without the need of registers having reset inputs and initialized speedily, while keeping the increase in the device elements at the minimum.

5 Claims, 5 Drawing Sheets

REGISTER CONTROL CIRCUIT FOR INITIALIZATION OF REGISTERS

BACKGROUND OF THE INVENTION

(1) Field of the Invention

The present invention relates to a register control circuit, and more particularly to a register control circuit for initializing registers without a dedicated reset input.

(2) Description of the Related Art

Conventionally, an initialization of a D-type flip-flop circuit (hereinafter referred to as "DFF") which is formed by 2-INPUT AND 2-INPUT NOR gates (hereinafter abbreviated as, e.g., "2AND2NOR gate") 1~4 and an inverter 5 as shown in FIG. 1A is performed by supplying a reset signal $S_{RST}$ directly to a 2AND3NOR gate 13 at a master stage and a 2AND3NOR gate 12 at a slave stage as shown in FIG. 1B, so that the outputs of 2AND2NOR gates 11, 14 are set to "1" and the outputs of the 2AND3NOR gates 12, 13 are set to "0", respectively. To initialize a multi-register circuit such as a shift register, a plurality of DFFs each having a reset input are used so as to form the shift register and a reset input signal is directly applied to the respective DFFs.

FIG. 2A shows an example of a conventional shift register and FIG. 2B shows timing-charts thereof.

In the conventional shift register shown in FIG. 2A, a plurality of the D-type flip-flop circuits (DFFs) R0~R7, each having an internal circuit of the same circuit configuration as that shown in FIG. 1B, are connected in series and are commonly supplied with shift clocks $S_{CK1}$, $S_{CK2}$ and a reset signal $S_{RST}$. A shift data $D_{IN}$ inputted from a shift data input terminal ($D_{IN}$) is outputted from a shift data output terminal $D_{OUT}$ through the DFFs R0~R7. While the reset signal $S_{RST}$ remains "0" immediately after the power is turned on, the states of the DFFs R0~R7 are and remain undefined. When the reset signal $S_{RST}$ is set to "1", the outputs of the DFFs R0~R7 are all and immediately initialized to "0". Subsequently, the shift clocks $S_{CK2}$ and $S_{CK1}$ are supplied and, though not shown in the timing charts given in FIG. 2B, the shift data is inputted to the input terminal $D_{IN}$ of the shift register circuit and is shifted out from the output terminal $D_{OUT}$.

One advantage of the above conventional shift register is that it can be immediately reset when the reset signal is set to "1" because each of the DFFs R0~R7 forming the shift register has a reset input terminal. However, since all bits are implemented by DFFs each having a reset input terminal, the shift register suffers from a disadvantage of requiring more logic elements in number than those which constitute DFFs having no reset input terminals as shown in FIG. 1A.

To avoid increasing in the number of elements, there has been known a shift register in which, as shown in FIG. 3A, a DFF having a reset input terminal is used for a DFF Q0 of the first stage and DFFs not having a reset input terminal are used for the remaining DFFs Q1~Q7 that follow. The operation of this shift register is described below. While the reset signal stays at "0" immediately after the power is turned on, the outputs of the DFFs Q0~Q7 remain undefined, respectively, as shown in the timing charts in FIG. 3B. When the reset signal $S_{RST}$ is set to "1", the first stage DFF Q0 is initialized immediately, but the remaining DFFs Q1~Q7 stay at undefined states since they are given no reset input.

Subsequently, when the shift clocks $S_{CK1}$ and $S_{CK2}$ are supplied to the respective DFFs with the reset signal being held at "1", the output "0" from the DFF Q0 is shifted into the following DFF Q1 in response to the first clock of the shift clocks, whereby the output of the DFF Q1 becomes "0". In response to the second clock of the shift clocks, the output of the DFF Q1 is shifted into the following DFF Q2 and, thus, the output of the DFF Q2 becomes "0". In a similar manner, the output of the DFF Q7 becomes "0" at last in response to the seventh clock of the shift clocks, thereby completing the initialization of the shift register. Thereafter, a shift data is loaded into the shift register from the data input terminal $D_{IN}$.

Since the above circuit adopts only one DFF which is equipped with a reset input terminal, it contributes substantially to the reduction in the number of the necessary elements. However, as can be readily understood from the timing charts shown in FIG. 3B, the circuit takes an extra amount of time to generate the shift clocks that are necessary to completely initialize the entire shift register. This suffers from the disadvantages of increasing the initialization time and also making the shift clock control for the register initialization more complex.

As described above, the conventional register initialization circuits have problems in that the number of the necessary elements is increasing because of the need to directly supply the reset signal to the respective DFFs and, in that the initialization time has increased because of the need for generating shift clocks for initialization. These problems in the conventional shift registers are to be solved by the present invention.

SUMMARY OF THE INVENTION

It is, therefore, an object of the invention to solve the problems existing in the conventional shift registers and to provide an improved shift register which is formed by registers having no reset inputs and in which an initialization can be performed speedily, while keeping the increase in the device elements at the minimum.

According to one aspect of the invention, there is provided a register control circuit comprising:
 a plurality of registers connected in series;
 a control circuit for generating a plurality of clock signals of different phases; and
 a logic circuit for receiving a reset signal ($S_{RST}$) and the plurality of clock signals, and outputting latch clocks to the plurality of registers, the latch clocks being made active during a partial or a full period in which the reset signal is active.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, some preferred embodiments of the invention will be explained with reference to the accompanying drawings.

Figure 4A:
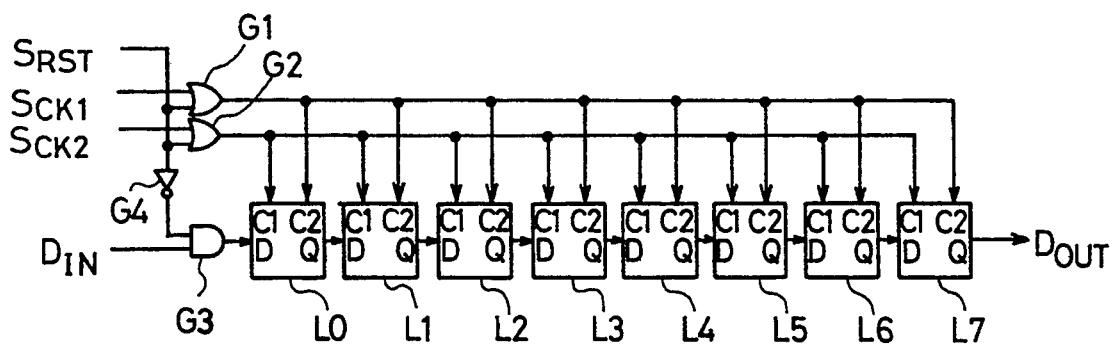
FIG. 4A is a circuit diagram of a shift register of a first embodiment according to the present invention.
Figure 4B:
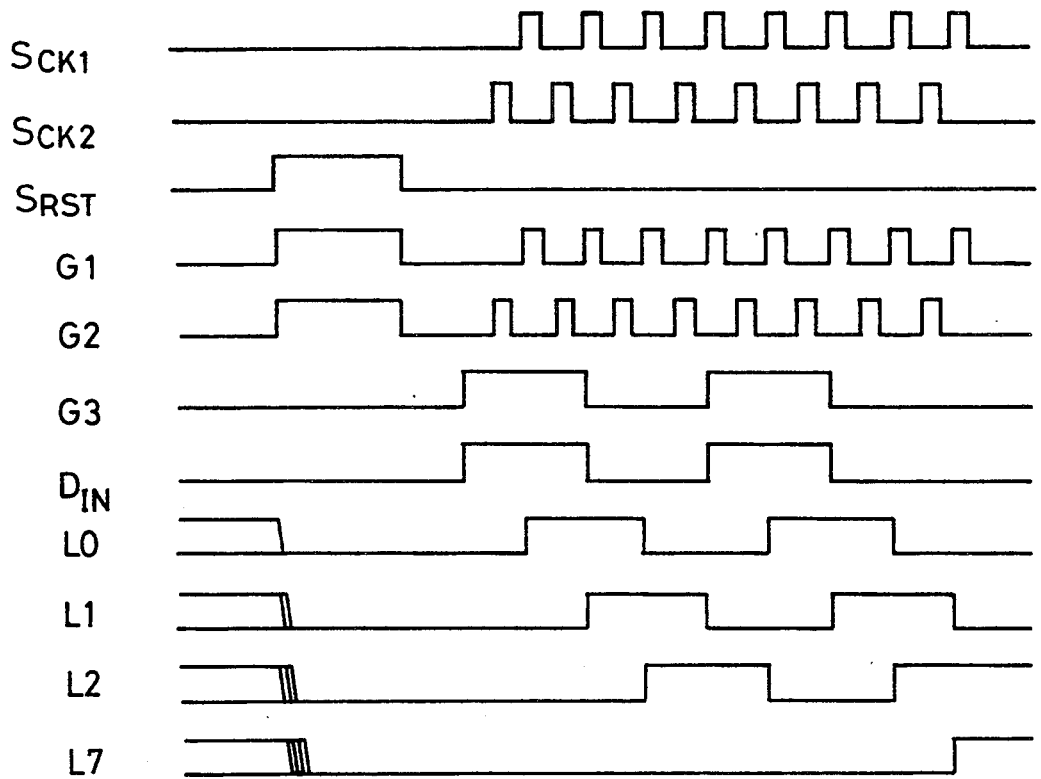
FIG. 4B are timing charts of tile shift register shown in FIG. 4A.

FIG. 4A shows a shift register of a first embodiment according to the invention. Shift clocks $S_{CK1}$, $S_{CK2}$ are inputted into 2-input OR gates G1 and G2, respectively, in each of which a logical OR is taken with a reset signal $S_{RST}$, and fed into a plurality of DFFs L0~L7 each of which has no reset input terminal. A shift input signal $D_{IN}$ together with an inverted reset signal is inputted to a 2-input AND gate G3. An output of the AND gate G3 is inputted to a first stage DFF L0.

Figure 1A:
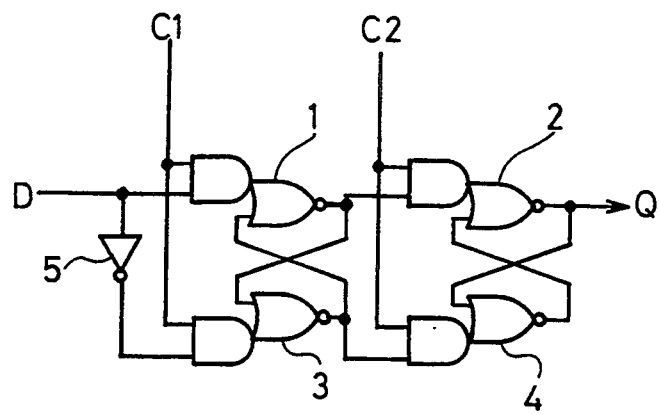
FIG. 1A is a circuit diagram of a conventional DFF circuit having no reset input terminal.
Figure 1B:
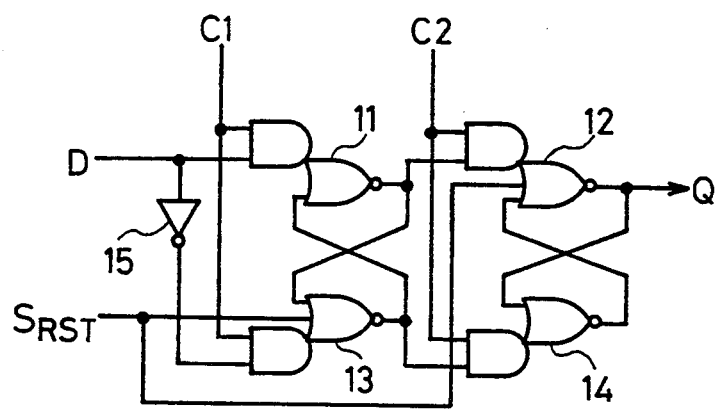
FIG. 1B is a circuit diagram of a conventional DFF circuit having a resent input terminal.

An operation of the above shift register is as follows. While the reset signal $S_{RST}$ is "0" immediately after the power is turned on, the shift clocks $S_{CK1}$ and $S_{CK2}$ are both at "0" and, thus, the states of the DFFs L0~L7 remain undefined. At this moment, since an output of an inverter G4 is "1", the input signal $D_{IN}$ is transferred to the output of the 2-input AND gate G3 as it is. When the reset input signal $S_{RST}$ becomes "1", the outputs of both the 2-input OR gates G1 and G2 become "1". Since the reset input signal $S_{RST}$ is now "1", the output of the inverter G4 is "0" and, thus, the output of the 2-input AND gate G3 is "0", whereby a "0" is inputted to the first-stage DFF L0. Since the clock inputs, that is, the outputs of the OR gates G1 and G2 supplied to the DFF L0 have been set to "1", which is the same as the DFF shown in FIG. 1A wherein the input signal D is "0" and the clock signal C1 is "1", the output of the inverter 5 becomes "1", the output of the 2AND2NOR gate 3 becomes "0", and the output of the 2AND2NOR gate 1 becomes "1". Since the clock signal C2 is also "1", the outputs from the master side are transferred to the slave side and, as a result, the output of the 2AND2-NOR gate 2 becomes "0" and that of the 2AND2NOR gate 4 becomes "1", thus completing tile initialization of this DFF. In this way, the initialization of the first stage DFF L0 is performed. Upon the completion of the initialization of the first stage DFF L0, the input signal which is forwarded to the second stage DFF L1 becomes "0". As a result, the DFF L1 is initialized in tile same manner as the DFF L0. Subsequently, the remaining DFFs L2 through L7 are sequentially initialized. The above operations occur asynchronously, so that, after a delay time corresponding to the 24 gate delay stages from the top stage DFF L0 to the final stage DFF L7, the initialization of the registers is completed. Since a delay time for a single gate is 1 ns or less, the total delay time amounts to 24 ns or less, which means that the registers can be initialized in a very short time. Since the shift register of this invention uses DFFs each of which has no reset input, only the control gates G1 through G4 entail an increased number of logic elements, which is negligible in a practical use.

Figure 6:
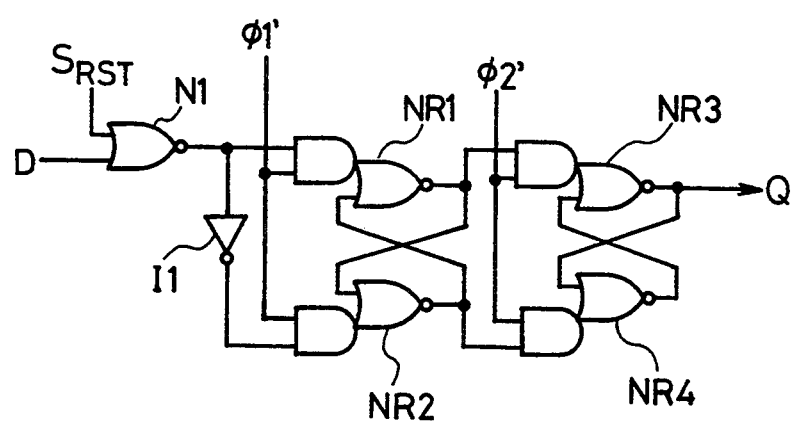
FIG. 6 is a circuit diagram of a DFF used in the microcomputer shown in FIG. 5A.
Figure 2A:
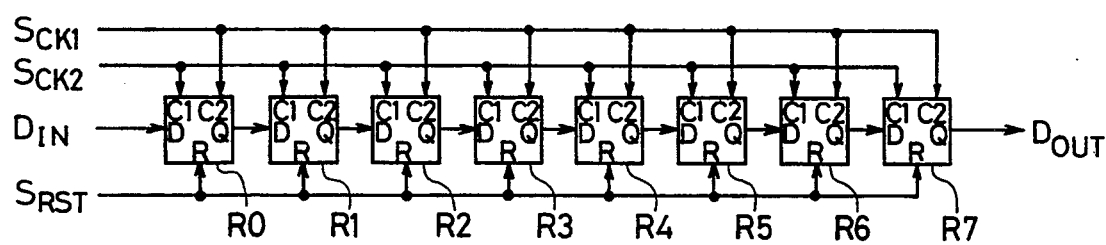
FIG. 2A is a circuit diagram showing a conventional shift register.
Figure 2B:
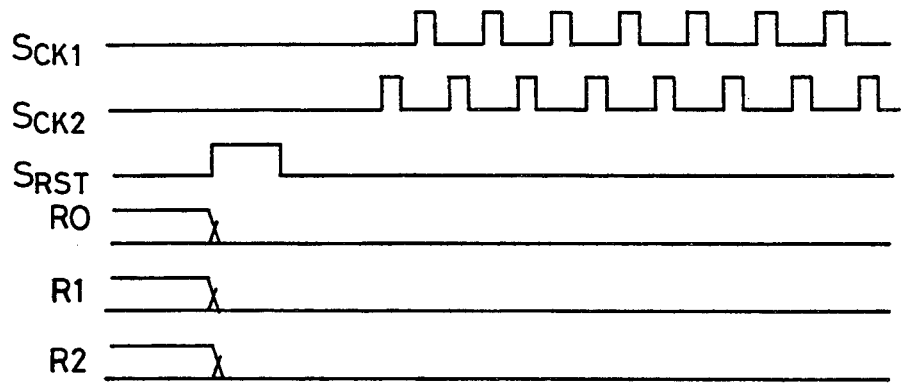
FIG. 2B are timing charts of the shift register shown in FIG. 2A.
Figure 3A:
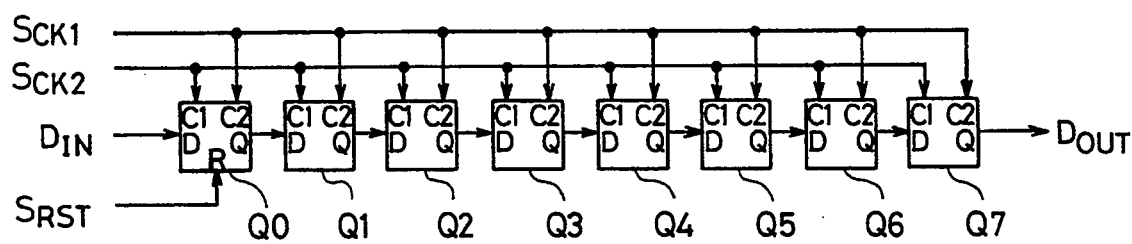
FIG. 3A is a circuit diagram showing another conventional shift register.
Figure 3B:
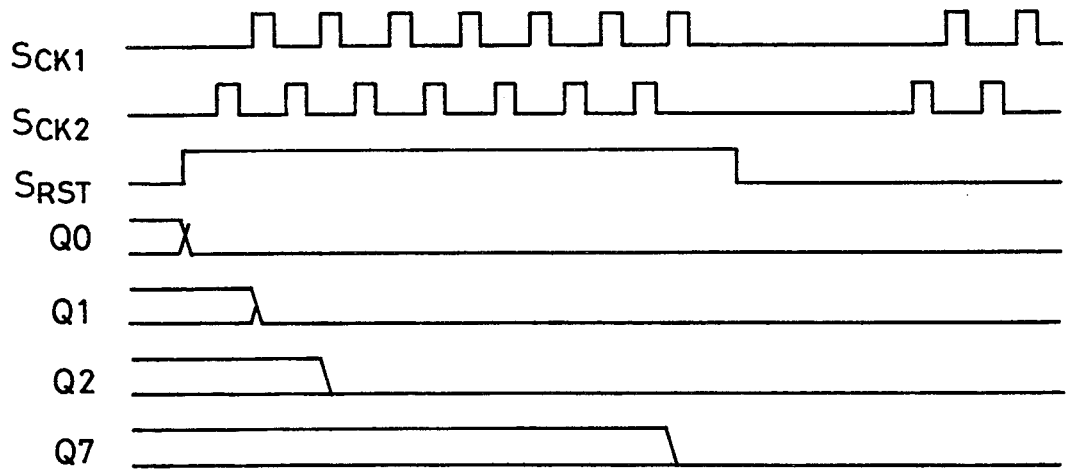
FIG. 3B are timing charts of the shift register shown in FIG. 3A.
Figure 5A:
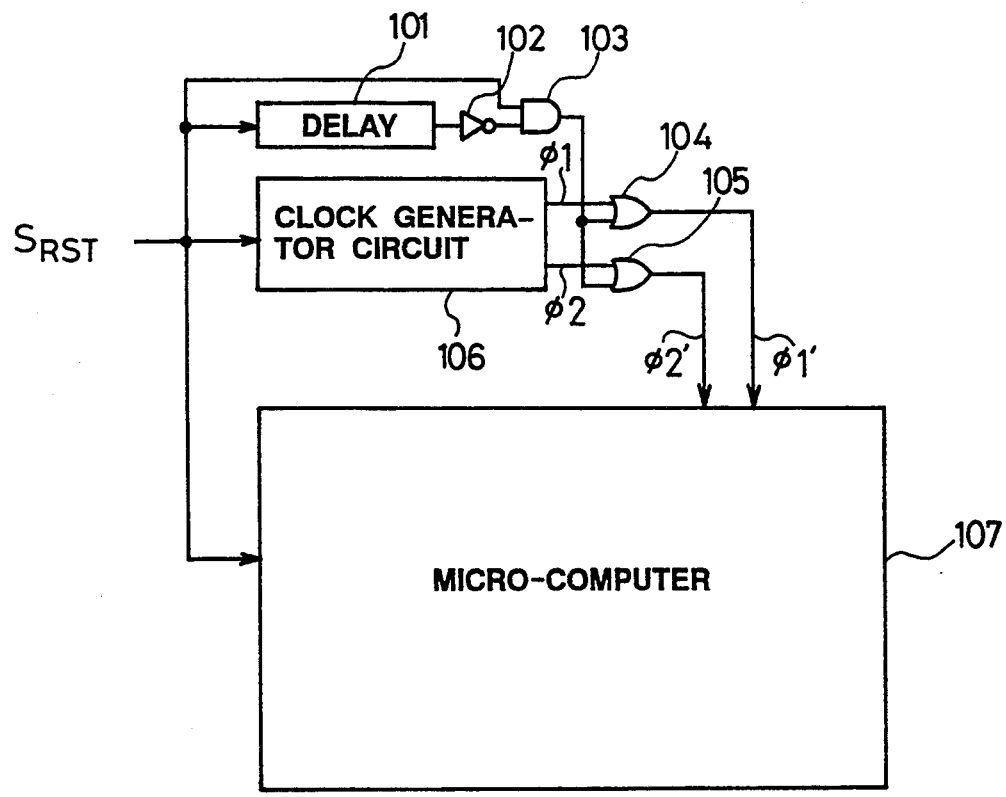
FIG. 5A is a circuit diagram of a register control circuit of a second embodiment according to the present invention, which is embodied to a microcomputer.
Figure 5B:
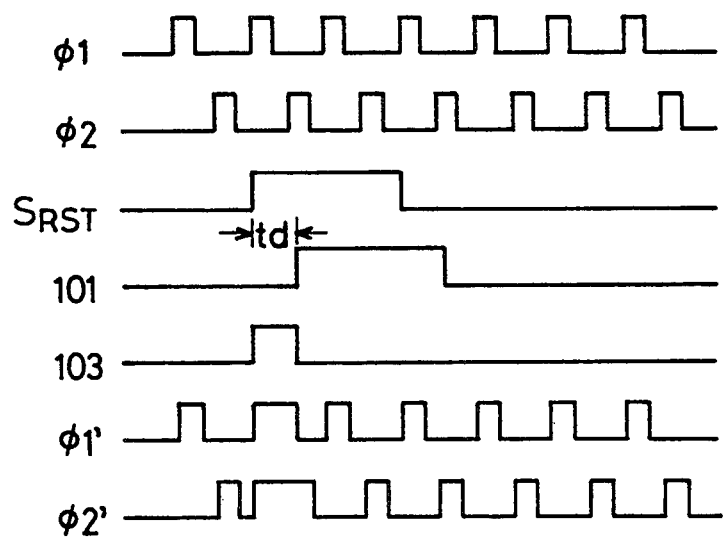
FIG. 5B are timing charts of the register control circuit shown in FIG. 5A.

Next, FIG. 5A shows a second embodiment of this invention. The circuit of this embodiment performs an initialization of the respective registers of an internal circuit of a microcomputer. As shown in the timing charts of FIG. 5B, while the reset input signal is "0", an output of an AND gate 103 is "0" and, thus, the signals $\phi1$ and $\phi2$ from the clock generator circuit 106 are supplied as they are to the microcomputer 107 as the system clocks $\phi1'$ and $\phi2'$. After the reset signal $S_{RST}$ rises to "1", an output of an inverter 102 becomes "0" after a delay time td which is established by a delay circuit 101 and, thus, the output of the AND gate 103 and also the outputs of 2-input OR gates 104, 105 are kept at "1" for the interval td. As shown in FIG. 6, in the internal circuit of the microcomputer 107, a register circuit is formed by a latch which has no reset input and comprises an inverter I1, 2AND2NOR gates NR1~NR4, and a 2-input NOR gate N1. When the clock signals $\phi1'$ and $\phi2'$ become "1" simultaneously, the output of the 2-input NOR gate N1 is forwarded to the master stage of the latch and, then, to the slave stage of the latch, in the same manner as described in the first embodiment, thus initializing the Q output of the register to "0". Since the microcomputer 107 uses a number of internal registers, this register control circuit can bring about substantial reduction in device elements as compared with the case where DFFs having reset inputs as shown in FIG. 2B are used.

As explained above, according to the present invention, it is possible to initialize stand-alone shift registers and registers in a microcomputer speedily and asynchronously by forcing the DFF latch clocks to become active based on a reset input, while keeping the increase in the device element at the minimum.

While the invention has been described in its preferred embodiments, it is to be understood that the words which have been used are words of description rather than limitation and that changes within the purview of the appended claims may be made without departing from the true scope and spirit of tile invention in its broader aspects.

What is claimed is:

1. A register control circuit comprising:
   a plurality of registers connected in series;
   a control circuit for generating a plurality of clock signals of different phases, said control circuit having a delay circuit with a delay time which receives said reset signal, an inverter which inverts a reset signal delayed by said delay circuit;
   a logic circuit for receiving a reset signal and said plurality of clock signals, and outputting latch clocks to said plurality of registers, said latch clocks being made active during a partial or a full period in which said reset signal is active; and
   an AND gate receiving at one input terminal said reset signal and at the other input terminal an output from said inverter and outputting a signal whose active duration corresponds to said delay time and is shorter than the full period in which said reset signal is active.

2. A register control circuit according to claim 1, in which said control circuit is a clock generator circuit for producing system clocks for a microcomputer.

3. A register control circuit according to claim 1, which further comprises an inverter coupled to receive said reset signal at its input terminal, and a two input AND gate coupled to receive an output from said inverter at one input terminal and to receive a shift data at other input terminal, and said AND gate having an output coupled to send a signal to a first one of said plurality of registers.

4. A register control circuit according to claim 1, which further comprises a two input NOR gate coupled to receive said reset signal at one input terminal, coupled to receive a shift data at the other input terminal and coupled to send an output signal to a first one of said plurality of registers.

5. A register control circuit comprising:

a plurality of registers connected in series:

a clock control circuit for generating a plurality of clock signals of different phases, said clock control circuit having a delay circuit with a delay time which receives a reset signal, an inverter circuit which inverts a delayed reset signal from said delay circuit, and a two input AND gate, means for applying said reset signal to one of said AND gate input terminals, and means for applying an output from said inverter to the other of said AND gate input terminals, and said AND gate having an output signal having an active duration corresponding to said delay time, and said output signal being shorter than the full period in which said reset signal is active; and a logic circuit coupled to receive said reset signal and said plurality of clock signals, and said logic circuit applying an output comprising latch clock pulse signals to said plurality of registers, said latch clock pulse signals being active during a range of a partial to a full period in which said reset signal is active.

* * * * *